United States Patent [19]
Smith

[11] Patent Number: 6,008,982
[45] Date of Patent: Dec. 28, 1999

[54] LOW PROFILE ELECTRICAL DISTRIBUTION CENTER AND METHOD OF MAKING A BUS SUBASSEMBLY THEREFOR

[75] Inventor: Randall Kent Smith, Fowler, Ohio

[73] Assignee: General Motors Corporation, Detroit, Mich.

[21] Appl. No.: 09/082,114

[22] Filed: May 20, 1998

[51] Int. Cl.$^6$ ...................................................... H02B 1/26
[52] U.S. Cl. .......................... 361/624; 361/749; 361/750; 361/772; 361/774; 361/752; 174/52.1; 439/66; 439/74; 439/76.1; 439/76.2
[58] Field of Search .................................... 361/624, 627, 361/637, 639, 641, 648; 174/52.1, 52.2; 439/76.1, 76.2

[56] References Cited

U.S. PATENT DOCUMENTS

| | | |
|---|---|---|
| 3,323,023 | 5/1967 | Walker ..................................... 361/707 |
| 3,810,300 | 5/1974 | Hulmes et al. . |
| 4,109,376 | 8/1978 | DiLiddo et al. . |
| 4,358,633 | 11/1982 | Reynolds, Jr. . |
| 4,684,765 | 8/1987 | Beck et al. . |
| 4,689,718 | 8/1987 | Maue et al. . |
| 4,695,926 | 9/1987 | McDermott . |
| 4,781,621 | 11/1988 | Sugiyama et al. ....................... 439/559 |
| 4,894,018 | 1/1990 | Phillips et al. . |
| 4,959,018 | 9/1990 | Yamamoto et al. . |
| 4,995,818 | 2/1991 | Saimoto ................................. 439/76.1 |
| 5,023,752 | 6/1991 | Detter et al. . |
| 5,034,850 | 7/1991 | Hernandez et al. . |
| 5,040,996 | 8/1991 | Kobold et al. . |
| 5,057,026 | 10/1991 | Sawai et al. . |
| 5,067,905 | 11/1991 | Matsumoto et al. ................... 439/76.2 |
| 5,154,647 | 10/1992 | Ishitani et al. . |
| 5,207,587 | 5/1993 | Hamill et al. . |
| 5,300,917 | 4/1994 | Maue et al. .............................. 361/648 |
| 5,310,353 | 5/1994 | Parrish et al. . |
| 5,622,507 | 4/1997 | Kasai ..................................... 439/76.2 |
| 5,764,487 | 6/1998 | Natsume ................................. 361/775 |

*Primary Examiner*—Donald Sparks
*Assistant Examiner*—Boris L. Chervinsky
*Attorney, Agent, or Firm*—Patrick M. Griffin

[57] ABSTRACT

A low profile electrical distribution center comprises a plurality of thin bus assemblies that are stacked one upon another. Each bus assembly comprises stamped metal circuit components having planar bus portions sandwiched between thin flexible upper and lower sheets of insulation material that are bonded together. The stamped metal circuit components have male blade terminals that extend up or down from the bus portions. The thin flexible sheets of insulation material are die cut to facilitate manufacture and assembly of the stamped metal circuit components from a one piece stamped metal blank.

10 Claims, 4 Drawing Sheets

LOW PROFILE ELECTRICAL DISTRIBUTION CENTER AND METHOD OF MAKING A BUS SUBASSEMBLY THEREFOR

TECHNICAL FIELD

This invention relates generally to electrical distribution centers for automobiles and more particularly to an electrical distribution center that has one or more bus assemblies and to a method of making the bus assembly.

BACKGROUND OF THE INVENTION

U.S. Pat. No. 5,023,752 granted to Gary C. Detter et al. Jun. 11, 1991, discloses an electrical power distribution center that comprises a bus plate assembly in the form of a plurality of vertically stacked circuit layers that eliminate or reduce the need for splices in the conductors of wiring harnesses. Each circuit layer comprises a plurality of stamped metal circuit components that are seated in tracks formed in the surface of an electrical insulating board. The stamped metal circuit components include male blade terminals that are perpendicular to the electrical insulating board. These male blade terminals project through slots extending through one or more of the electrical insulating boards.

The circuit layers are stacked vertically and fastened inside a two-part housing by a plurality of bolts. When the circuit layers are fastened in place, some male blade terminals project through slots in bottom of the lower housing part to provide socket connectors for wiring harnesses. Other male blade terminals project upwardly from the stack of circuit layers and have double ended female terminals attached to them. Electric and electronic components are then plugged into the top of the top housing part and the double-ended female connectors located below the top. A detachable cover is then secured in place to protect the electric and electronic components that are plugged into the top of the housing.

This electrical power distribution center arrangement has been used successfully by the assignee of this invention. However, the vertically stacked arrangement of circuit layers is cumbersome and expensive to manufacture and assemble. Moreover, the vertically stacked arrangement of several circuit layers require substantial vertical space to meet terminal density requirements resulting in a high profile for the electrical power distribution center.

U.S. Pat. No. 5,207,587 granted to Brian D. Hamill et al. May 4, 1993, discloses an electrical distribution center that has an improved bussing arrangement. The Hamill electrical distribution center has a main bus plate assembly that comprises a plurality of stamped metal circuit components that are insert molded in an insulation board. These stamped metal circuit components include several male blade terminals that project outwardly of the insulation board and that include wire-receiving slots. The main bus plate assembly is sandwiched between upper and lower auxiliary bus plate assemblies of the type that are disclosed in U.S. Pat. No. 4,684,765 granted to Lawrence R. Beck et al. Aug. 4, 1987. Each of these bus plate assemblies include a plurality of wire circuit components in an insulated routing board that has slots extending through it.

This electrical distribution center also has been used successfully by the assignee of this invention. While the main bus plate and auxiliary bus plate assemblies is less cumbersome than the vertically stacked circuit layers of the Detter et al. '752 arrangement, the main bus plate assembly is still expensive to manufacture and assemble. Moreover, the combination of the main bus plate and auxiliary bus plate assemblies still require substantial vertical space to meet terminal density requirements resulting in a high profile for the electrical distribution center.

SUMMARY OF THE INVENTION

The object of this invention is to provide an electrical distribution center having one or more bus assemblies that are economical to manufacture and assemble and that require very little vertical space resulting in a low profile for the electrical distribution center.

A feature of the invention is that the electrical distribution center has one or more bus assemblies in which stamped metal circuit components have portions that are sandwiched between two thin flexible sheets of insulation material to provide individual unit handled bus subassemblies.

Another feature of the invention is that the electrical distribution center has individual bus subassemblies that are thin so that several bus assemblies can be stacked one upon another to provide high terminal density while retaining a low profile for the electrical distribution center.

Still another feature of the invention is that the electrical distribution center has one or more unit handled bus subassemblies having stamped metal circuit components that are singulated from a one piece stamped metal blank that has been sandwiched between two thin flexible sheets of insulation material to economize manufacture and assembly of the electrical distribution center.

Yet another feature of the invention is that the electrical distribution center has one or more bus subassemblies that are flexible thus enhancing terminal alignment and facilitating assembly of the electrical distribution center.

Still yet another feature of the invention is that the electrical center has one or more bus subassemblies that are unit handled so that the bus subassemblies can be manufactured at one facility and assembled into electrical distribution centers at another facility.

These and other objects, features and advantages of the invention will become apparent from the description below, which is given by way of example with reference to the accompanying drawings.

DESCRIPTION OF THE PREFERRED EMBODIMENT

Figure 1:
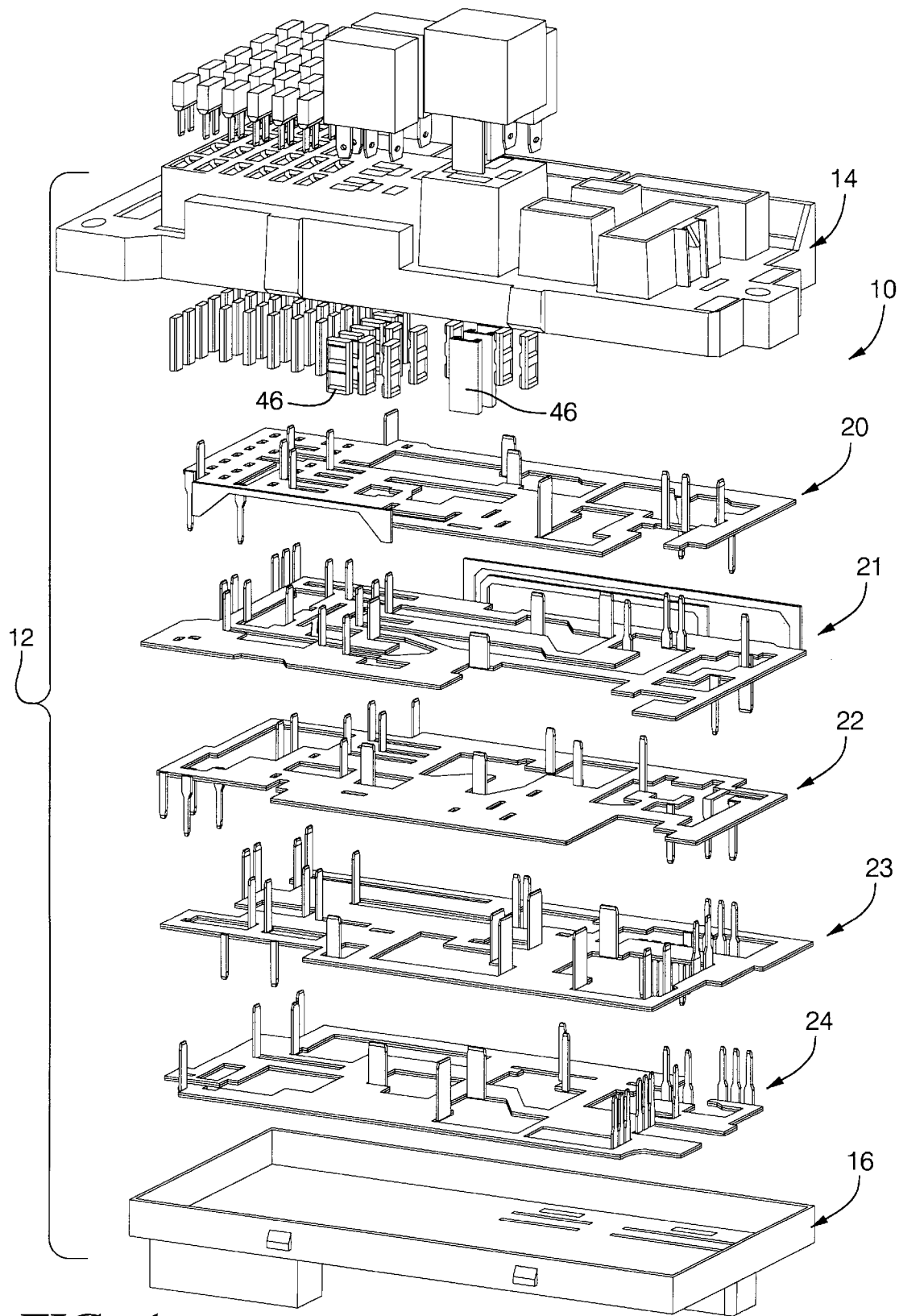
FIG. 1 is an exploded perspective view of an electrical distribution center in accordance with the invention.

Referring to FIG. 1, an electrical distribution center 10 provides an electrical interconnect between electrical and electronic devices such as mini-fuses, maxi-fuses and relays that are plugged into the top of a housing 12 of the electrical distribution center and electrical connectors (not shown) of electrical wiring harnesses that are plugged into socket connectors in the bottom of the housing 12. See for instance U.S. Pat. Nos. 5,023,752 and 5,207,587 discussed above and which are incorporated herein by reference.

The electrical distribution center 10 typically includes the housing 12 that has an upper housing part 14 and a lower housing part 16 that are fastened together in a suitable manner such as by bolts as shown in the two patents referenced above. A cover (shown in the two referenced patents but not here) is also commonly detachably fastened to the upper housing part 14 to protect the electrical and electronic devices that are plugged into the top of the housing 12.

The electrical distribution center 10 typically includes one or more bus subassemblies that are disposed within the housing 12 to make the desired electrical interconnections between the devices that are plugged into the top of the upper housing part 14 and the wiring harness connectors that are plugged into the socket connectors in the lower housing part 16. In this particular example, the electrical distribution center includes five (5) bus subassemblies 20, 21, 22, 23 and 24. A typical bus subassembly 20 is illustrated in more detail in FIG. 2.

Figure 2:
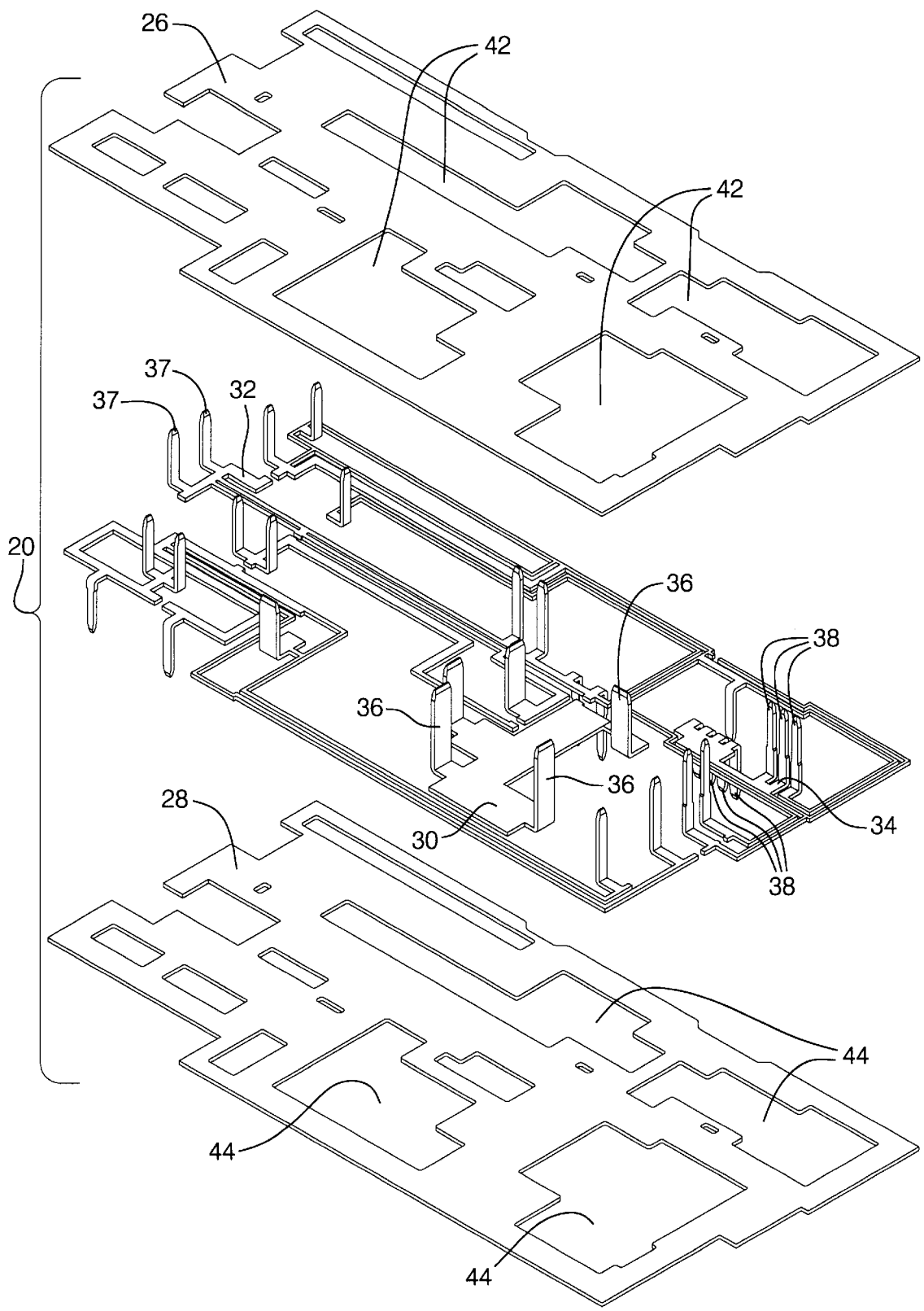
FIG. 2 is an exploded perspective view of a typical bus subassembly of the electrical distribution center shown in FIG. 1.

Referring now to FIG. 2, the typical bus assembly 20 comprises an upper thin flexible sheet 26 of insulation material, a lower thin flexible sheet 28 of insulation material and several stamped metal circuit components 30, 32, 34, etc. of various types and shapes that are arranged in a predetermined pattern by the upper and lower insulation sheets 26 and 28. Each of these circuit components includes a planar portion sandwiched between insulation sheets 26 and 28 and male blade terminals that protrude outwardly of the insulation sheet 26 and/or the insulation sheet 28. Such circuit components are typically used in primary high voltage circuits.

Another typical circuit component 32 includes a plurality of narrow male blade terminals 37 extending upwardly and still another typical circuit component 34 includes very narrow blade terminals 38 extending in opposite directions. Circuit components 32 and 34 are typically used in secondary low voltage circuits. Each circuit component may comprise several male blade terminals such as terminals 36, 37 and/or 38 interconnected by a planar carrier or bus portion 40. Carrier 40 mechanically and electrically connects all of the male blade terminals attached to the carrier. Any number of wide and narrow male blade terminals may be connected by a planar carrier and the male blade terminals may extend in either or both directions depending upon circuit requirements. However, each of the stamped metal circuit components 30, 32 and 34 include at least one male blade terminal that projects outwardly of a planar carrier or bus portion 40 of the stamped metal circuit component.

Upper insulation layer 26 is die cut with a pattern of cut-outs 42 of various sizes and shapes and lower insulation layer 28 is die cut with a similar pattern of cut-outs 44. Cut-outs 42 and 44 facilitate manufacture of bus subassembly 20 as explained below. Cut-outs 42 and 44 also accommodate passage of the male blade terminals of bus assemblies 21, 22, 23 and 24 through bus subassembly 20 when bus subassemblies 20, 21, 22, 23 and 24 are installed in the electrical distribution center.

Bus subassemblies 21, 22, 23 and 24 are all similar to bus subassembly 20 in that each comprises upper and lower thin flexible sheets of insulation material and several stamped metal circuit components. However, the sizes, shapes and patterns of cut-outs in the insulation sheets and the shapes and arrangements of the metal circuit components of each bus subassembly varies depending on circuit requirements.

Figure 3:
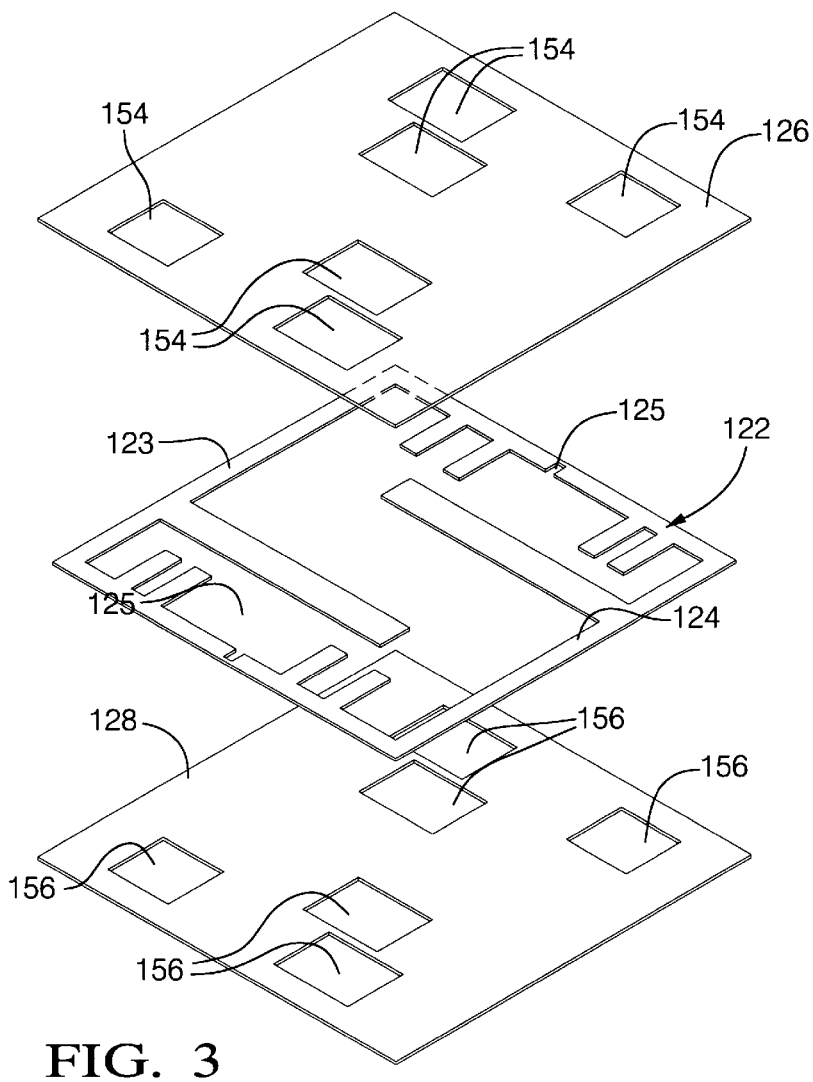
FIGS. 3, 4, 5 and 6 are perspective schematic views showing various stages in the manufacture of a bus subassembly in accordance with the invention.
Figure 4:
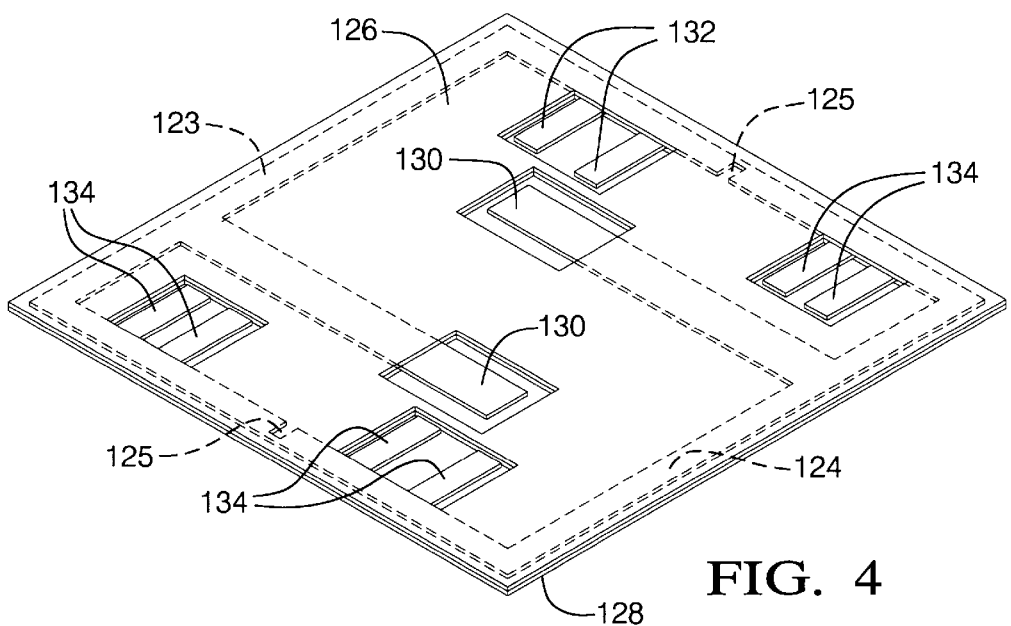

A simplified bus subassembly is schematically represented in FIGS. 3, 4, 5 and 6 to explain the manufacture of bus subassemblies such as bus subassemblies 20, 21, 22, 23 and 24. A one piece, flat blank 122 that includes a plurality of metal circuit components 123 and 124 connected by bridge portions 125 is stamped from sheet metal as shown in FIG. 3. A sheet of CDA 260 about 0.8 mm in thickness would typically be used. CDA 260 is commonly referred to as cartridge brass and typically comprises 70% copper and 30% zinc. It is available from Olin Brass Corp. of East Alton, Ill.

A thin, upper flexible sheet 126 of insulation material and a thin lower flexible sheet 128 of insulation material are die cut with several cut-outs 154 and 156 of various sizes and shapes, respectively to assist in forming male blade terminals for the stamped metal circuit components 123 and 124. The thin flexible sheets of insulation material are typically made of polyester film having a thickness in the range of 0.005–0.020 inches.

The upper surface of the lower thin flexible sheet 128 is coated with an adhesive, such as 3M 9471, a pressure sensitive rubber base adhesive film available from 3M Corporation of Minneapolis, Minn. The stamped metal blank 122 is placed on top of the adhesively coated lower thin flexible sheet 128. The lower surface of the thin upper flexible sheet 126 is coated with an adhesive, such as 3M 9471 and placed on top of the stamped metal blank 122. The adhesively coated thin flexible sheets 126 and 128 are then laminated together sandwiching planar bus portions of the stamped metal blank 122 between the upper and lower sheets 126 and 128 while leaving other portions of blank 122 exposed by cutouts 154 and 156 (shown in FIG. 3).

Figure 5:
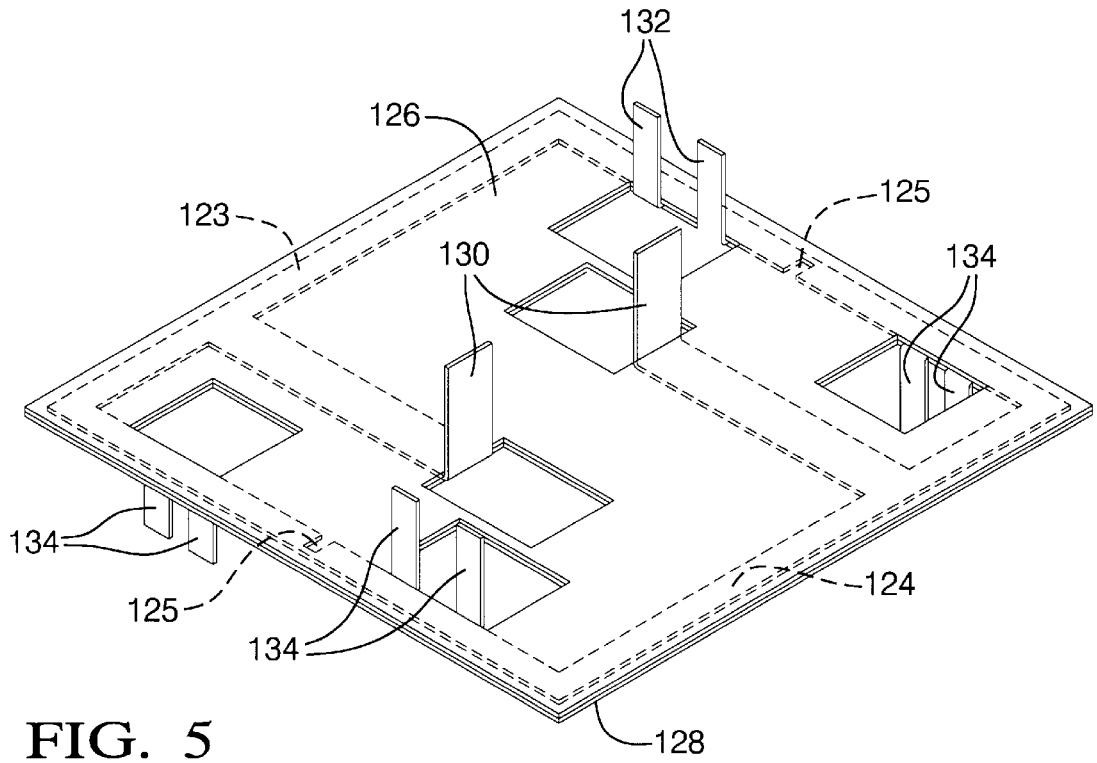
Figure 6:
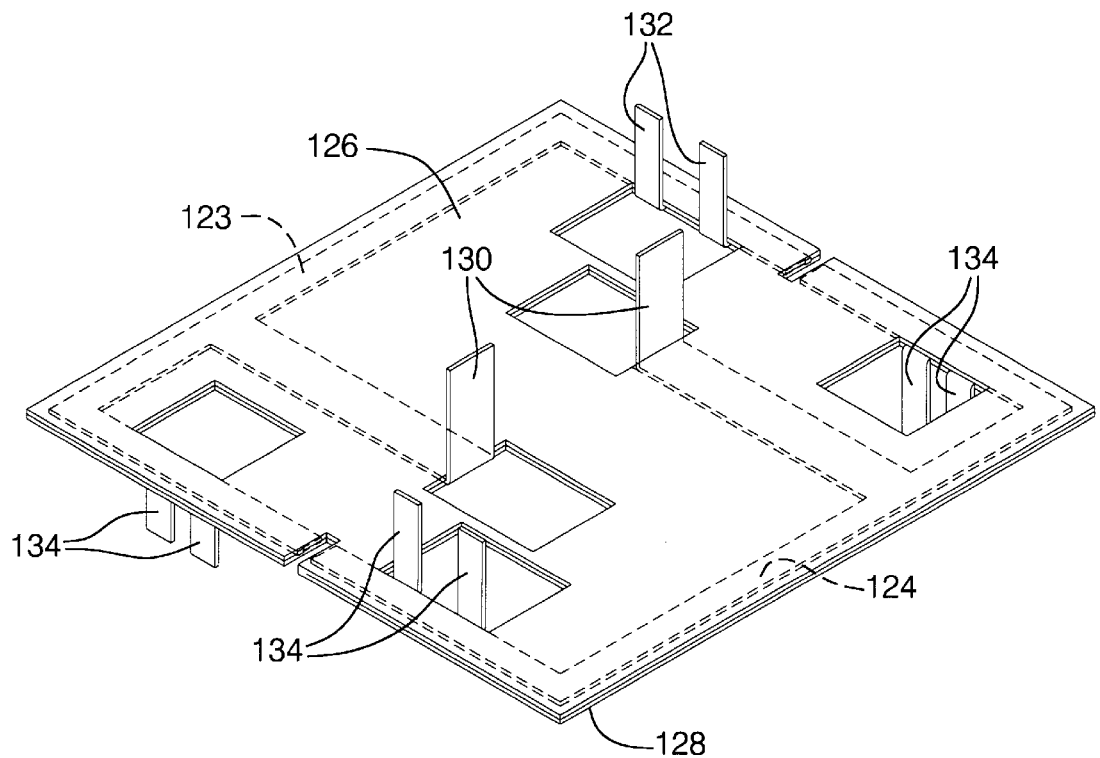

Selected parts of the exposed portions of blank 122 are then bent up perpendicularly to the planar bus portions to form the male blade terminals 130, 132 and 134 as shown in FIG. 5. The metal circuit components 123 and 124 are then singularized by removing bridge portions 125 to space adjacent ends of metal circuit components 123 and 124 from each other. The result is a unit handled, bus subassembly shown in FIG. 6 that is very thin and flexible.

Bus subassemblies 20, 21, 22, 23 and 24 are made as unit handled subassemblies in basically the same manner with more sophisticated stamped metal blanks and die cut insulation sheets as illustrated in FIG. 1. The unit handled bus subassemblies 20, 21, 22, 23 and 24 are then stacked vertically one upon another. The stacked bus subassemblies 20, 21, 22, 23 and 24 are then assembled into the lower housing part 16 and double ended female terminals 46 of various sizes are connected to the male blade terminals 36, 37 and 38 protruding above the uppermost bus subassembly 20. The upper housing part 14 is then attached to the lower housing part 16 securing the five (5) bus subassemblies within the housing 12.

The electrical distribution center 10 is now ready for providing an electrical interconnection between electrical and electronic devices such as mini-fuses, maxi-fuses and relays that are plugged into the top of upper housing part 14 and electrical wiring harnesses that are plugged into socket connectors in the bottom of lower housing part 16.

While the electrical distribution center 10 has been shown as having five (5) thin, flexible, unit handled bus subassemblies 20, 21, 22, 23 and 24, a greater or lesser number of unit handled, bus subassemblies may be used depending on circuit and terminal density requirements. The number of subassemblies has little effect on the height requirements of the electrical distribution center 10 because the incremental thickness of each bus subassembly that is added or subtracted is about 0.040 inches (1.0 mm). Hence, a low profile can be maintained with a greater number of bus subassemblies and the invention contemplates an electrical distribution center having more than five (5) bus subassemblies. In other words, the invention has been described in an illustrative manner, and it is to be understood that the terminology, which has been used, is intended to be in the nature of words of description rather than of limitation.

Obviously, many modifications and variations of the present invention in light of the above teachings may be made. It is, therefore, to be understood that, within the scope of the appended claims, the invention may be practiced otherwise than as specifically described.

I claim:

1. A bus assembly for use in an electrical distribution center for providing electrical interconnections between electrical and electronic devices and electrical connectors of wire harnesses, said bus assembly comprising;
    a thin three-layer laminate made up of a central layer comprising a planar array of a plurality of stamped metal circuit components and an insulation sandwich arrangement for fixing therebetween the stamped metal circuit components in a predetermined pattern,
    each of the stamped metal circuit components having at least one male blade terminal that projects outwardly of a carrier portion of the stamped metal circuit component,
    the insulation sandwich arrangement including a lower thin flexible sheet of insulation material and an upper thin flexible sheet of insulation material,
    the lower thin flexible sheet of insulation having portions engaging a bottom surface of the carrier portion of each of the stamped metal circuit components,
    and the upper thin flexible sheet of insulation material having portions engaging a top surface of the carrier portion of each of the stamped metal circuit components, and
    the lower thin flexible sheet of insulation material and the upper thin flexible sheet of insulation material each having portions adherently bonded to each other to form a unit handled bus subassembly.

2. The electrical distribution center bus assembly as defined in claim 1 wherein the upper and the lower thin flexible sheets of insulation material are made of polyester film having a thickness in the range of 0.005–0.020 inches.

3. The electrical distribution center bus assembly as defined in claim 1 wherein the upper and the lower thin flexible sheets of insulation material each have a plurality of pre-formed cut-outs registered in sandwich assembly to facilitate manufacture and stacking of the bus subassembly with one or more additional such subassemblies to form an electrical distribution center.

4. An electrical distribution center having a plurality of said unit handled bus subassemblies as defined in claim 1 that are stacked one upon another such that said carrier portion of said stamped metal components of each said subassembly are insulated from the carrier portions of said stamped metal components of the next adjacent subassembly by at least two of said sheets of insulation material.

5. An electrical distribution center for providing electrical interconnections between electrical and electronic devices and electrical connectors of wire harnesses comprising;
    a plurality of unit handled bus assemblies that are stacked one upon another, each of the unit handled bus subassemblies including a plurality of stamped metal circuit components and an insulation sandwich arrangement for fixing therebetween the associated stamped metal circuit components in a predetermined pattern,
    each of the stamped metal circuit components having at least one male blade terminal that projects outwardly of a planar carrier portion of the stamped metal circuit component,
    each said insulation sandwich arrangement consisting essentially of a lower thin flexible sheet of insulation material and an upper thin flexible sheet of insulation material,
    the lower thin flexible sheet of insulation having portions engaging a bottom surface of the planar carrier portion of each of the associated stamped metal circuit components,
    the upper thin flexible sheet of insulation material having portions engaging a top surface of the planar carrier portion of each of the associated stamped metal circuit components,
    the lower thin flexible sheet of insulation material and the upper thin flexible sheet of insulation material of each said subassembly each having portions bonded to each other to form a unit handled bus subassembly, and
    the upper and the lower thin flexible sheets of insulation material each having a plurality of individually registering preformed cut-outs registered in sandwich assembly to facilitate manufacture and stacking the unit handled bus subassemblies by said terminals passing through associated cut-outs.

6. The electrical distribution center as defined in claim 5 wherein the upper and the lower thin flexible sheets of insulation material are made of polyester film having a thickness in the range of 0.005–0.020 inches.

7. The electrical distribution center as defined in claim 5, wherein each said stamped metal circuit component comprises a planar one-piece sheet metal blank having a plurality of metal circuit components initially connected by bridge portions and arranged in a predetermined pattern, and wherein said plurality of cut-outs of said upper and the lower thin flexible sheets of insulation material are oriented to expose portions of said sheet metal blank, and wherein said male blade terminals comprise selected parts of said exposed portions of said sheet metal blank that are bent upright through individually associated cut-outs, and wherein said metal circuit components are singulated by parting gaps formed by removal of each of said bridge portions to thereby space adjacent ends of the metal circuit components and thus electrically disconnect such components from each other.

8. The electrical distribution center as defined in claim 7 wherein each of said metal circuit components has a planar carrier portion trapped between said upper and lower thin flexible sheets of insulation material by the portions of said sheets that are bonded to each other.

9. The electrical distribution center as defined in claim 8 wherein said selected parts of the exposed portions of the sheet metal blank are bent perpendicularly with respect to the planar carrier portion to provide at least one of said male blade terminals for each sheet metal circuit component.

10. The electrical distribution center as defined in claim 9 wherein said upper and lower thin flexible sheets of insulation material each have a plurality of preformed cut-outs registered in pairs in sandwich assembly with the associated metal circuit components, said cut-outs being constructed and arranged relative to the remainder of said bus subassemblies to facilitate stacking on one another in said electrical distribution center by having said upright male blade terminals individually passing through associated ones of said sandwich registering and stacking registering cut-outs.

* * * * *